United States Patent
Djayaprawira et al.

(10) Patent No.: US 8,934,290 B2
(45) Date of Patent: Jan. 13, 2015

(54) MAGNETORESISTANCE EFFECT DEVICE AND METHOD OF PRODUCTION OF THE SAME

(71) Applicants: Canon Anelva Corporation, Kawasaki-shi (JP); National Institute of Advanced Industrial Science and Technology, Tsukuba-shi (JP)

(72) Inventors: David D. Djayaprawira, Tama (JP); Koji Tsunekawa, Hachiooji (JP); Motonobu Nagai, Akishima (JP); Hiroki Maehara, Mitaka (JP); Shinji Yamagata, Fuchu (JP); Naoki Watanabe, Nishi-tokyo (JP); Shinji Yuasa, Tsukuba (JP)

(73) Assignees: Canon Anelva Corporation, Kanagawa (JP); National Institute of Advanced Industrial Science Nad Technology, Ibaraki (JP)

( * ) Notice: Subject to any disclaimer, the term of this patent is extended or adjusted under 35 U.S.C. 154(b) by 0 days.

(21) Appl. No.: 14/032,815

(22) Filed: Sep. 20, 2013

(65) Prior Publication Data

US 2014/0024140 A1 Jan. 23, 2014

Related U.S. Application Data

(63) Continuation of application No. 12/983,514, filed on Jan. 3, 2011, now abandoned, which is a continuation of application No. 11/219,866, filed on Sep. 7, 2005, now abandoned.

(30) Foreign Application Priority Data

Sep. 7, 2004 (JP) .................. 2004-259280

(51) Int. Cl.
*G11C 11/00* (2006.01)
*H01L 43/12* (2006.01)
(Continued)

(52) U.S. Cl.
CPC ............. *H01L 43/12* (2013.01); *B82Y 25/00* (2013.01); *B82Y 40/00* (2013.01); *C23C 14/081* (2013.01);
(Continued)

(58) Field of Classification Search
USPC ................... 365/158, 55, 173, 171
See application file for complete search history.

(56) References Cited

U.S. PATENT DOCUMENTS 5,506,063 A 4/1996 Kamijo et al.
5,817,366 A 10/1998 Arai et al.
(Continued)

FOREIGN PATENT DOCUMENTS

EP 0 145 403 A2 6/1985
EP 1 061 592 12/2000
(Continued)

OTHER PUBLICATIONS

Shinji Yuasa et al., "High Tunnel Magnetoresistance At Room Temperature in Fully Epitaxial Fe/MgO/Fe Tunnel Junctions Due to Coherent Spin-Polarized Tunneling", Japanese Journal of Applied Physics, Express Letter, 2004, pp. L588-L590, vol. 43, No. 4B, The Japan Society of Applied Physics (cited in the specification).
(Continued)

*Primary Examiner* — Fernando Hidalgo
(74) *Attorney, Agent, or Firm* — Buchanan Ingersoll & Rooney PC

(57) ABSTRACT

A magnetoresistance effect device including a multilayer structure having a pair of ferromagnetic layers and a barrier layer positioned between them, wherein at least one ferromagnetic layer has at least the part contacting the barrier layer made amorphous and the barrier layer is an MgO layer having a highly oriented texture structure.

3 Claims, 4 Drawing Sheets

(51) Int. Cl.
*B82Y 25/00* (2011.01)
*B82Y 40/00* (2011.01)
*C23C 14/08* (2006.01)
*C23C 14/34* (2006.01)
*G11C 11/16* (2006.01)
*H01F 10/32* (2006.01)
*H01F 41/30* (2006.01)
*H01L 43/08* (2006.01)
*H01F 41/18* (2006.01)

(52) U.S. Cl.
CPC ............. *C23C 14/34* (2013.01); *G11C 11/16* (2013.01); *H01F 10/3254* (2013.01); *H01F 41/307* (2013.01); *H01L 43/08* (2013.01); *H01F 10/3204* (2013.01); *H01F 41/18* (2013.01)
USPC .............. 365/158; 365/55; 365/173; 365/171

(56) References Cited

U.S. PATENT DOCUMENTS

| | | | |
|---|---|---|---|
| 5,945,694 | A | 8/1999 | Reyes et al. |
| 6,181,537 | B1 | 1/2001 | Gill |
| 6,201,672 | B1 | 3/2001 | Pinarbasi |
| 6,252,750 | B1 | 6/2001 | Gill |
| 6,275,362 | B1 | 8/2001 | Pinarbasi |
| 6,828,260 | B2 | 12/2004 | Sharma et al. |
| 6,831,312 | B2 | 12/2004 | Slaughter et al. |
| 6,839,206 | B2 | 1/2005 | Saito et al. |
| 6,927,952 | B2 | 8/2005 | Shimizu et al. |
| 6,999,287 | B2 | 2/2006 | Hayashi et al. |
| 7,149,105 | B2 | 12/2006 | Brown et al. |
| 7,220,498 | B2 * | 5/2007 | Nagahama et al. ........ 428/811.1 |
| 7,252,852 | B1 | 8/2007 | Parkin |
| 7,262,064 | B2 | 8/2007 | Ohba et al. |
| 7,270,896 | B2 * | 9/2007 | Parkin ................. 428/811.1 |
| 7,408,749 | B2 | 8/2008 | Bill |
| 7,443,639 | B2 | 10/2008 | Parkin |
| 7,453,672 | B2 | 11/2008 | Dieny et al. |
| 7,570,463 | B2 | 8/2009 | Parkin |
| 7,595,967 | B1 * | 9/2009 | Moon et al. ............... 360/324.2 |
| 7,598,555 | B1 | 10/2009 | Parkin |
| 2002/0064595 | A1 | 5/2002 | Nomura et al. |
| 2003/0128483 | A1 | 7/2003 | Kamijo |
| 2004/0082201 | A1 | 4/2004 | Sharma et al. |
| 2004/0136232 | A1 | 7/2004 | Hosomi et al. |
| 2004/0139914 | A1 | 7/2004 | Yamazaki et al. |
| 2004/0144995 | A1 | 7/2004 | Nagahama et al. |
| 2004/0234818 | A1 | 11/2004 | Tanahashi et al. |
| 2004/0257719 | A1 | 12/2004 | Ohba et al. |
| 2005/0110004 | A1 | 5/2005 | Parkin et al. |
| 2006/0012926 | A1 | 1/2006 | Parkin et al. |
| 2006/0125034 | A1 | 6/2006 | Ohba et al. |
| 2006/0216161 | A1 | 9/2006 | Chaix et al. |
| 2006/0261425 | A1 | 11/2006 | Suemitsu et al. |
| 2007/0195592 | A1 | 8/2007 | Yuasa |
| 2008/0055793 | A1 | 3/2008 | Djayaprawira et al. |
| 2008/0124454 | A1 | 5/2008 | Djayaprawira et al. |
| 2008/0180862 | A1 | 7/2008 | Djayaprawira et al. |
| 2008/0212243 | A1 | 9/2008 | Zhao et al. |
| 2008/0253039 | A1 | 10/2008 | Nagamine et al. |
| 2009/0128167 | A1 | 5/2009 | Hamada et al. |

FOREIGN PATENT DOCUMENTS

| | | |
|---|---|---|
| EP | 1 793 434 A1 | 6/2007 |
| FR | 2 840 925 A1 | 12/2003 |
| JP | 2002-289943 | 10/2002 |
| JP | 2002-359413 | 12/2002 |
| JP | 2003-079780 | 3/2003 |
| JP | 2003-086863 | 3/2003 |
| JP | 2003-267750 | 9/2003 |
| JP | 2003-304010 | 10/2003 |
| JP | 2003-318465 | 11/2003 |
| JP | 2004-063592 | 2/2004 |
| JP | 2004-128015 | 4/2004 |
| JP | 2004-153258 | 5/2004 |
| JP | 2005-071555 | 3/2005 |
| KR | 2002-0042448 | 6/2002 |
| KR | 2003-0097904 | 12/2003 |
| WO | 01/56090 | 8/2001 |

OTHER PUBLICATIONS

C. L. Platt et al., "Spin Polarized Tunneling in Reactively Sputtered Tunnel Junctions" J. Appl. Phys. 1997, vol. 81, No. 8, pp. 5523-5525.
R. Matsumoto et al., "Tunneling Spectra of Sputter-Deposited CoFeB/MgO/CoFeB Magnetic Tunnel Junctions Showing Giant Tunneling Magnetoresistance Effect" Solid State Communications, 2005, vol. 136, pp. 611-615.
Stuart S. P. Parkin et al.,"Giant Tunnelling Magnetoresistance at Room Temperature with MgO (100) Tunnel Barriers" Nature Materials, 2004, vol. 1 pp. 862-867.
Djayaprawira et al., "230% Room-Temperature Magnetoresistance in CoFeB/MgO/CoFeB Magnetic Tunnel Junctions", Applied Physics Letters, vol. 86, 092502, Feb. 23, 2005.
Moodera et al., "Large Magnetoresistance at Room Temperature in Ferromagnetic Thin Film Tunnel Junctions", Physical Review Letters, vol. 74, No. 16, pp. 3273-3276, Apr. 17, 1995.
Julliere et al., "Tunneling Between Ferromagnetic Films", Physics Letters, vol. 54A, No. 3, pp. 225-226, Sep. 8, 1975.
Zhang et al., "Quenching of Magnetoresistance by Hot Electrons in Magnetic Tunnel Junctions", Physical Review Letters, vol. 79, No. 19, pp. 3744-3747, Nov. 10, 1997.
Mathon et al., "Theory of Tunneling Magnetoresistance of an Epitaxial Fe/MgO/Fe(001) Junction", Physical Review B, vol. 63, 220403(R), May 10, 2001.
Butler et al., "Spin-Dependent Tunneling Conductance of Fe/MgO/Fe Sandwiches", Physical Review B, vol. 63, 054416, Jan. 8, 2001.
Araki et al., "Fabrication and Electric Properties of Lapped Type of TMR Heads for ~50 Gb/In$^2$ and Beyond", IEEE Transactions on Magnetics, vol. 38, No. 1, Jan. 2002.
Wolf et al., "Spintronics: A Spin-Based Electronics Vision for the Future", Science, vol. 294, pp. 1488-1495, Nov. 16, 2001.
Yuasa et al., "Magnetic Tunnel Junctions with Single-Crystal Electrodes: A Crystal Anisotropy of Tunnel Magneto-Resistance", Europhysics Letters, vol. 52, No. 3, pp. 344-350, Nov. 1, 2000.
Yuasa et al., "Spin-Polarized Resonant Tunneling in Magnetic Tunnel Junctions", Science, vol. 297, pp. 234-237, Jul. 12, 2002.
Wulfhekel et al., "Single-Crystal Magnetotunnel Junctions", Applied Physics Letters, vol. 78, No. 4, pp. 509-511, Jan. 22, 2001.
Yu et al., "Electron Transport Properties in Magnetic Tunnel Junctions with Epitaxal NiFe (111) Ferromagnetic Bottom Electrodes", Applied Physics Letters, vol. 82, No. 26, pp. 4735-4737, Jun. 30, 2003.
Mitani et al., "Fe/MgO/FeCO(100) Epitaxial Magnetic Tunnel Junctions Prepared by Using In Situ Plasma Oxidation", Journal of Applied Physics, vol. 93, No. 10, pp. 8041-8043, May 15, 2003.
Bowen et al., "Large Magnetoresistance in Fe/MgO/FeCO(001) Epitaxial Tunnel Junctions on GaAs(001)", Applied Physics Letters, vol. 79, No. 11, pp. 1655-1657, Sep. 10, 2001.
Faure-Vincent et al., "High Tunnel Magnetoresistance in Epitaxial Fe/MgO/Fe Tunnel Junctions", Applied Physics Letters, vol. 82, No. 25, pp. 4507-4509, Jun. 23, 2003.
Tanaka et al., "Spin-Valve Heads in the Current-Perpendicular-to-Plane Mode for Ultrahigh-Density Recording", IEEE Transactions on Magnetics, vol. 38, No. 1, pp. 84-88, Jan. 2002.
Takagishi et al., "The Applicability of CPP-GMR Heads for Magnetic Recording", IEEE Transactions on Magnetics, vol. 38, No. 5, pp. 2277-2282, Sep. 2002.
Nagasaka et al.,"CPP Operational Mode of GMR Head", Fujitsu Sci. Tech. J., vol. 37, No. 2, pp. 192-200, Dec. 2001.
Wang et al., "70% TMR at Room Temperature for SDT Sandwich Junctions with CoFeB as Free and Reference Layers", IEEE Transactions on Magnetics, vol. 40, No. 4, Jul. 2004.
Yuasa et al., "High Tunnel Magnetoresistance at Room Temperature in Fully Epitaxial Fe/MgO/Fe Tunnel Junctions due to Coherent

(56) References Cited

OTHER PUBLICATIONS

Spin-Polarized Tunneling", Japanese Journal of Applied Physics, vol. 43, No. 4B, pp. L588-L590, 2004.
Yuasa et al. "Giant Room-Temperature Magnetoresistance in Single-Crystal Fe/MgO/Fe Magnetic Tunnel Junctions", Nature Materials, vol. 3, pp. 868-871, Dec. 2004.
Parkin et al., "Giant Tunnelling Magnetoresistance at Room Temperature with MgO (100) Tunnel Barriers", Nature Materials, vol, 3, pp. 862-867, Dec. 2004.
Moodera et al., "Interface Magnetism and Spin Wave Scattering in Ferromagnet-Insulator-Ferromagnet Tunnel Junctions", Physical Review Letters, vol. 80, No. 13, pp. 2941-2944, Mar. 30, 1998.
Murai et al., "Direct Observation of Magnon Excitation in a Ferromagnetic Tunnel Junction Using Inelastic-Electron-Tunneling Spectroscopy", Jpn. J. Appl. Phys., vol. 38, pp. L1106-L1108, Oct. 1999.
Simmons, "Generalized Formula for the Electric Tunnel Effect Between Similar Electrodes Separated by a Thin Insulating Film", Journal of Applied Physics, vol. 34, No. 6, pp. 1793-1803, Jun. 1963.
Ando et al., "Spin-Dependent Tunneling Spectroscopy in Single-Crystal Fe/MgO/Fe Tunnel Junctions", Applied Physics Letters, vol. 87, Sep. 2005.
Wolf, "Tunneling in Normal-State Structures", Principles of Electron Tunneling Spectroscopy, pp. 356-363, 1985.
"Scanning Tunneling Microscopy (STM)", The British Library—"The World's Knowledge", pp. 11-209.
Office Action issued Jul. 29, 2008 in corresponding JP Application No. 2004-259280.
English Translation of Office Action issued Jul. 29, 2008 in corresponding JP Application No. 2004-259280.
Notification of First Examination Opinion in CN 2005100987654 dated Sep. 5, 2008, and a partial English Translation thereof.
Matsumoto et al. "Dependence on annealing temperatures of tunneling spectra in high-resistance CoFeB/MgO/CoFeB magnetic tunnel junctions", Solid State Communications, vol. 143, pp. 574-578, 2007.
Nozaki et al. "Substantial reduction in the depinning field of vortex domain walls triggered by spin-transfer induced resonance", Applied Physics Letters, vol. 91, pp. 082502-1-082502-3, 2007.
Takeuchi et al. "Crystallization of amorphous CoFeB ferromagnetic layers in CoFeB/MgO/CoFeB magnetic tunnel junctions", Japanese Journal of Applied Physics, vol. 46, No. 25, pp. L623-L626, 2007.
Hong et al. "Difference between chemical structures of the interface at the Al-oxide tunneling barrier prepared by plasma or by radical oxidation", Applied Surface Science, vol. 253, pp. 7632-7638, 2007.
Tsunekawa et al. "Deposition and micro-fabrication processes for magnetic tunnel junctions in semiconductor manufacturing lines", Magnetics Japan, vol. 2, No. 7, pp. 358-363, 2007.
Suzuki et al. "Microwave properties of spin injection devices-spontaneous oscillation, spin-torque diode effect and magnetic noise-", Magnetics Japan, vol. 2, No. 6, pp. 282-290, 2007.
Kubota et al. "Spin-torque-induced magnetization reversal in magnetic tunnel junctions with an MgO barrier", Magnetics Japan, vol. 2, No. 6, pp. 274-281, 2007.
Otani et al. "Microfabrication of magnetic tunnel junctions using $CH_3OH$ etching", IEEE Transactions on Magnetics, vol. 43, No. 6, pp. 2776-2778, Jun. 2007.
Padhan et al. "Frequency-dependent magnetoresistance and magnetocapacitance properties of magnetic tunnel junctions with MgO tunnel barrier", Applied Physics Letters, vol. 90, pp. 142105-1-142105-3, 2007.
Yamanaka et al. "Improvement of perpendicular magnetic recording (PMR) media properties and reduction of Ru film thickness using NiCr (NiFeCr)/Pd dual seedlayer", Canon ANELVA Technical Report, vol. 13, pp. 28-31, 2007.
Otani et al. "Thermal stability of spin-transfer switching in CPP-GMR devices", Journal of Magnetism and Magnetic Materials, vol. 310, pp. 2026-2028, 2007.
Negusse et al. "Magnetic characterization of CoFeB/MgO and CoFe/MgO interfaces", Applied Physics Letters, vol. 90, pp. 092502-1-092502-3, 2007.
Choi et al. "Transmission electron microscopy study on the polycrystalline CoFeB/MgO/CoFeB based magnetic tunnel junction showing a high tunneling magnetoresistance, predicted in single crystal magnetic tunnel junction", Journal of Applied Physics, vol. 101, 013907-1-013907-4, 2007.
Choi et al. "Effect of Ta getter on the quality of MgO tunnel barrier in the polycrystalline CoFeB/MgO/CoFeB magnetic tunnel junction", Applied Physics Letters, vol. 90, 012505-1-012505-3, 2007.
Tsunekawa et al. "Influence of chemical composition of CoFeB on tunneling magnetoresistance and microstructure in polycrystalline CoFeB/MgO/CoFeB magnetic tunnel junctions", Japanese Journal of Applied Physics, vol. 45, No. 43, pp. L1152-L1155, 2006.
Nagamine et al. "Ultralow resistance-area product of $0.4\,\Omega(\mu m)^2$ and high magnetoresistance above 50% in CoFeB/MgO/CoFeB magnetic tunnel junctions", Applied Physics Letters, vol. 89, 162507-1-162507-3, 2006.
Kubota et al. "Dependence of spin-transfer switching current on free layer thickness in Co-Fe-B/MgO/Co-Fe-B magnetic tunnel junctions", Applied Physics Letters, vol. 89, 032505-1-032505-3, 2006.
Maehara et al. "Study of magnetic tunnel junctions using an MgO tunnel barrier with an ultra-thin Mg insertion layer", J. Magn. Soc. Jpn., vol. 30, No. 4, pp. 443-446, 2006.
Tsunekawa et al. "Giant tunneling magnetoresistance effect in low-resistance CoFeB/MgO(001)/CoFeB magnetic tunnel junctions for read-head applications", Applied Physics Letters, vol. 87, 072503-1-072503-3, 2005.
Djayaprawira et al. "Development of tunneling magnetoresistance device using Mgo barrier layer", Canon ANELVA Technical Report, vol. 12, pp. 11-19, 2006.
Suzuki et al., "New Phase of Metal spintronics devices—Spin-Torque Diode," Canon ANELVA Technical Report vol. 12, pp. 5-10, 2006.
Otani et al., "Spin-transfer switching property in the CPP-GMR devices with Co-Fe and Co-Fe-B free layers", J. Magn. Soc. Jpn., vol. 30, pp. 192-195, 2006.
Tsunekawa et al. "Huge magnetoresistance and low junction resistance in magnetic tunnel junctions with crystalline MgO barrier", IEEE Transactions on Magnetics, vol. 42, No. 2, pp. 102-107, Feb. 2006.
Kubota et al., "Spin-transfer switching in MgO barrier based MTJs", Materials of Topical Symposium of the Magnetic Society of Japan, vol. 145, pp. 43-48, 2006.
Matsumoto et al., "Tunneling spectra of sputter-deposited CoFeB/MgO/CoFeB magnetic tunnel junctions showing giant tunneling magnetoresistance effect", Solid State Communications, vol. 136, pp. 611-615, 2005.
Tulapurkar et al. "Spin-torque diode effect in magnetic tunnel junctions", Nature, vol. 438, pp. 339-342, Nov. 2005.
Kubota et al., "Evaluation of spin-transfer switching in CoFeB/MgO/CoFeB magnetic tunnel junctions", Japanese Journal of Applied Physics, vol. 44, No. 40, pp. L1237-L1240, 2005.
Kubota et al. "Magnetization switching by spin-polarized current in low-resistance magnetic tunnel junction with MgO(001) barrier", IEEE Transactions on Magnetics, vol. 41, No. 10, pp. 2633-2635, Oct. 2005.
Tsunekawa et al. "Sputter-deposition techniques for fabricating high-performance tunnel-magnetoresistive films", J. Magn. Soc. Jpn., vol. 29, No. 9, pp. 856-862, 2005.
Tsunekawa et al. "Giant tunneling magnetoresistance effect in low-resistance CoFeB/MgO(001)/CoFeB magnetic tunnel junctions for read-head applications", Applied Physics Letters, vol. 87, pp. 072503-1072503-3, 2005.
Osada et al. "Dry etching of magnetic thin film stacks using CO/NH3 and CH3OH gases for tunneling magneto-resistance devices", ANELVA Technical Report, vol. 11, pp. 25-28, 2005.
Tsunekawa et al. "Surface treatment techniques in fabrication of GMR and TMR films", J. Magn. Soc. Jpn., vol. 28, No. 11, pp. 1074-1080, 2004.

(56) References Cited

OTHER PUBLICATIONS

Djayaprawira et al. "Novel sputtering technology of magnetic tunnel junctions for MRAM application," Papers of the 66th Symposium on Semiconductors and Integrated Circuits Technology, vol. 66, pp. 58-61, 2004.

Kakuta et al., "Novel PVD tool for magnetoresistive random access memory (MRAM) mass production", ANELVA Technical Report, vol. 10, pp. 27-33, 2004.

Kobayashi et al. "TMR devices fabricated with RIE etching using CO+NH3", J. Magn, Soc. Jpn., vol. 28, No. 2, pp. 176-179, 2004.

Osada et al. "Dry etching of magnetic thin film stacks using CO/NH3 and CH3OH gases for tunneling magneto-resistance devices", 2004 Dry Process International Symposium, vol. 4, pp. 127-131, 2004.

Domon et al. "Reduction of magnetic interaction in CoB/Pd multilayer perpendicular media using a phase-separated Pd-SiO underlayer", Journal of Applied Physics, vol. 93, No. 10, pp. 8164-8166, May 2003.

Domon et al. "Effect of Ge addition on postannealed CoCrGePt thin film media", Journal of Applied Physics, vol. 91, No. 10, pp. 8632-8634, May 2002.

Yoshimura et al., "Magnetic grain size reduction by using oxygen exposure process onto very thin island-like WCr seedlayer in longitudinal recording media", Journal of Applied Physics, vol. 91, No. 10, pp. 8629-8631, May 2002.

Djayaprawira et al. "Grain size reduction by utilizing a very thin, high-melting-point WCr seed-layer in longitudinal media: media noise reduction in high $H_k^{grain}$ media", J. Magn. Soc. Jpn., vol. 25, pp. 627-630, 2001.

Shimatsu et al. "Effect of Pt on the magnetic anisotropy and intergranular exchange coupling in $(Co_{86}Cr_{12}Ta_2)_{100-x}Pt_x$ and $(Co_{62.5}Ni_{30}Cr_{7.5})_{100-x}PT_x$ thin-film media", Journal of Magnetism and Magnetic.

Materials, vol. 155, pp. 246-249, 1996.

Nagamine et al. "Development of ultra-low resistance CoFeB/Mgo/CoFeB magnetic tunnel junctions", Canon ANELVA Technical Report, vol. 14, pp. 30-34, 2008.

Yuasa et al. "Giant tunnel magnetoresistance in magnetic tunnel junctions with a crystalline MgO(001) barrier", Journal of Physics D: Applied Physics, vol. 40, pp. R337-R354, 2007.

Choi et al. "Significant reduction of coercivity without reduction of tunneling magnetoresistance ratio of CoFeB/MgO/CoFeB-based magnetic tunnel junction using sandwich-structured free layer", Applied Physics Letters, vol. 91, pp. 172507-1-172507-3, 2007.

Djayaprawira et al. "Ultra-Low-Resistance Magnetic Tunnel Junctions with a Crystalline MgO Barrier for HDD Read Head Application", Magnetics Japan, vol. 2, No. 10, pp. 496-502, 2007.

Djayaprawira et al., "230% Room Temperature Magnetoresistance in CoFeB/MgO/CoFeB Magnetic Tunnel Junctions," Technical Report of the Institute of Electronics, Information and Communication Engineers, vol. 104, pp. 5-6, 2005.

Office Action issued on Apr. 10, 2009 in U.S. Appl. No. 11/876,916.

Office Action issued on Jun. 12, 2009 in U.S. Appl. No. 11/969,049.

Office Action issued on Jun. 26, 2009 in U.S. Appl. No. 12/058,147.

Extended European Search Report, European Application No. 08159511.8.-2222/1973178, dated Jun. 5, 2009.

Office Action issued in KR 10-2009-0048073 dated Jul. 27, 2009, and an English and Japanese Translation thereof.

Office Action issued on Mar. 23, 2010 in U.S. Appl. No. 11/876,916.

Office Action issued on Nov. 30, 2009 in U.S. Appl. No. 11/969,049.

Office Action issued on Jan. 6, 2010 in U.S. Appl. No. 12/058,147.

Office Action issued on Mar. 15, 2011 in U.S. Appl. No. 12/058,147.

Office Action issued on Mar. 14, 2011 in U.S. Appl. No. 11/969,049.

Office Action issued on Mar. 18, 2010 in U.S. Appl. No. 11/969,049.

Office Action issued on Feb. 3, 2011 in U.S. Appl. No. 11/876,916.

Office Action issued on Nov. 15, 2010 in U.S. Appl. No. 11/876,916.

Office Action issued on Dec. 14, 2009 in U.S. Appl. No. 11/876,916.

European Search Report, European Application No. 05077020.5, dated Jul. 11, 2007.

Parkin et al., "Giant tunneling magnetoresistance at room temperature with MgO (1000) tunnel barriers," Nature Materials, vol. 3, Dec. 2004, pp. 862-867.

* cited by examiner (A)

(B)

MAGNETORESISTANCE EFFECT DEVICE AND METHOD OF PRODUCTION OF THE SAME

BACKGROUND OF THE INVENTION

1. Field of the Invention

The present invention relates to a magnetoresistance effect device and a method of production of the same, more particularly relates to a magnetoresistance effect device fabricated utilizing a simple sputtering film-formation method and having an extremely high magnetoresistance ratio and a method of production of the same.

2. Description of the Related Art

In recent years, as nonvolatile memories, magnetic memory devices called "magnetoresistive random access memories (MRAMs)" have come into attention and have started entering the commercial stage. MRAMs are simple in structure, so ultra-high density integration to the gigabit level is easy. In MRAMs, the relative orientation of the magnetic moment is utilized to create the storage action. As the result, the number of possible re-writability is extremely high and the operating speed can be reduced to the nanosecond level.

FIG. 4 shows the structure of the MRAM. In the MRAM 101, 102 is a memory device, 103 a word line, and 104 a bit line. The large number of memory devices 102 are arranged at intersecting positions of the plurality of word lines 103 and plurality of bit lines 104 and are arranged in a lattice-like positional relationship. Each of the large number of memory devices 102 stores 1 bit of information.

Each memory device 102 of the MRAM 101, as shown in FIG. 5, is comprised of a magnetoresistance effect device for storing 1 bit of information, that is, a tunneling magnetoresistance (TMR) device 110, and a transistor 106 having a switching function at the intersecting position of the word line 103 and bit line 104. The main element in the memory device 102 is the TMR device 110. The basic structure of the TMR device, as shown in FIG. 6, is a three-layer structure comprised of a bottom ferromagnetic metal electrode (bottom ferromagnetic layer) 107/tunnel barrier layer 108/top ferromagnetic metal electrode (top ferromagnetic layer) 109. The TMR device 110 is therefore comprised of a pair of ferromagnetic layers 107 and 109 and a tunnel barrier layer 108 positioned between them.

In the TMR device 110, as shown in FIG. 6, the required voltage is applied across the ferromagnetic layers 107 and 109 at the two sides of the tunnel barrier layer 108 to cause the flow of a predetermined current. In that state, an external magnetic field is applied. When the directions of magnetization of the ferromagnetic layers 107 and 109 are parallel and the same (called the "parallel state"), the electrical resistance of the TMR device becomes the minimum ((A) state: resistance value $R_P$), while when the directions of magnetization of the ferromagnetic layers are parallel but opposite (called the "anti-parallel state"), the electrical resistance of the TMR device becomes the maximum ((B) state: resistance value $R_A$). Therefore, the TMR device 110 can take a parallel state and an anti-parallel state induced by an external magnetic field and store information as a change in resistance value.

To realize a practical gigabit class MRAM using the above TMR device, the difference between the resistance value $R_p$ of the "parallel state" and resistance value $R_A$ of the "anti-parallel state" has to be large. As the indicator, the magnetoresistance ratio (MR ratio) is used. The MR ratio is defined as "$(R_A-R_p) \div R_p$".

To raise the MR ratio, in the past, the electrode materials of the ferromagnetic metal electrodes (ferromagnetic layers) have been optimized, the method of production of the tunnel barrier layers have been modified, etc. For example, Japanese Patent Publication (A) No. 2003-304010 and Japanese Patent Publication (A) No. 2004-63592 propose several optimum examples of use of $Fe_xCo_yB$, etc. for the material of the ferromagnetic metal electrode.

The MR ratio of the TMR device disclosed in Japanese Patent Publication (A) No. 2003-304010 and Japanese Patent Publication (A) No. 2004-63592 is lower than about 70%. Further improvement of the MR ratio is necessary.

Further, recently, regarding a single crystal TMR thin film using an MgO barrier layer, there has been a report of using molecular beam epitaxy (MBE) and an ultra-high vacuum evaporation system to fabricate an Fe/MgO/Fe single crystal TMR thin film and obtain an MR ratio of 88% (Yuasa, Shinji et al., "High Tunnel Magnetoresistance at Room Temperature in Fully Epitaxial Fe/MgO/Tunnel Junctions due to Coherent Spin-Polarized Tunneling", Nanoelectronic Institute, Japanese Journal of Applied Physics, issued Apr. 2, 2004, Vol. 43, No. 4B, p. L588-L590). This TMR thin film has a completely epitaxial single crystal structure.

Fabrication of the single crystal TMR thin film used for the single crystal MgO barrier layer described in the above publication requires use of an expensive MgO single crystal substrate. Further, epitaxial growth of an Fe film by an expensive MBE device, formation of an MgO film by ultrahigh vacuum electron beam evaporation and other sophisticated film deposition technology are required. There is the problem that the longer the film deposition time, the less suitable the process for mass production.

OBJECTS AND SUMMARY

An object of the present invention is to provide a magnetoresistance effect device having a high MR ratio, improving the mass producibility, and improving the practicality and a method of production of the same.

One embodiment of the magnetoresistance effect device and method of production of the same according to the present invention are configured as follows to achieve the above object.

This magnetoresistance effect device includes a multilayer structure comprised of a pair of ferromagnetic layers and a barrier layer positioned between them, wherein at least the part of at least one of the ferromagnetic layers contacting the barrier layer is amorphous, and the barrier layer is an MgO layer having a single crystal or highly oriented fiber-texture structure. Here, the fiber-texture structure corresponds to assembly of poly-crystalline grains, in which the crystal structure is continuous across the layer thickness. However, in the longitudinal (in-plane) direction the grain boundaries can be observed. Highly oriented means that the crystallographic orientation in the film thickness direction is very uniform, while there is no specific crystallographic orientation in the plane direction. Preferably, the (001) crystal plane of MgO barrier layer lies parallel to the ferromagnetic layer surface. Here, the MgO layer can be either single crystal or highly oriented fiber-texture structure.

According to above magnetoresistance effect device, since the barrier layer has a single crystal or highly oriented fiber-texture structure, the flow of current between the ferromagnetic layers can be made straight and the MR ratio can be made an extremely high value.

In the magnetoresistance effect device, preferably the MgO layer is a single crystal layer formed by the sputtering method. However, an MgO layer with highly oriented fiber-texture structure also yield excellent properties. According to this configuration, the intermediate barrier layer can be produced simply. This is suitable for mass production.

In the magnetoresistance effect device, preferably the MgO layer is a single crystal layer formed using an MgO target and the sputtering method. The MgO layer can also be a highly oriented fiber-texture structure.

In the magnetoresistance effect device, preferably the ferromagnetic layers are CoFeB layers.

The method of production of a magnetoresistance effect device is a method of production of a magnetoresistance effect device including a multilayer structure comprised of a pair of ferromagnetic layers and a barrier layer positioned between them, comprising forming at least one ferromagnetic layer so that at least at least the part contacting the barrier layer is amorphous and forming the barrier layer having a single crystal or highly oriented fiber-texture structure by using the sputtering method. Further, in the method of production of a magnetoresistance effect device, preferably the MgO layer is formed by RF magnetron sputtering using an MgO target.

According to the present invention, since the tunnel barrier layer forming the intermediate layer of the TMR device or other magnetoresistance effect device is an MgO layer having a single crystal or highly oriented fiber-texture structure, the MR ratio can be made extremely high. When using this as a memory device of an MRAM, a gigabit class ultra-high integrated MRAM can be realized. Further, by forming the a single crystal or highly oriented fiber-texture MgO layer by the sputtering method, it is possible to fabricate a magnetoresistance effect device suitable for mass production and having high practical applicability.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, a preferred embodiment of the present invention will be explained with reference to the attached drawings.

Figure 1:
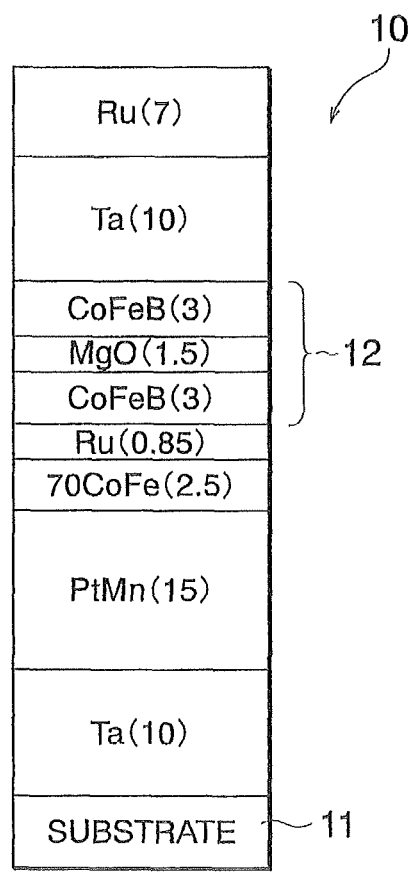
FIG. 1 is a view of the structure of a magnetoresistance effect device (TMR device) according to an embodiment of the present invention.

FIG. 1 shows an example of the multilayer structure of a magnetoresistance effect device according to the present invention, in particular shows the multilayer structure of a TMR device. According to this TMR device 10, a substrate 11 is formed with a multilayer film comprised of for example nine layers forming the TMR device 10. In this nine-layer multilayer film, magnetic films etc. are stacked from the bottommost first layer to the topmost ninth layer with "Ta", "PtMn", "70CoFe", "Ru", "CoFeB", "MgO", "CoFeB", "Ta", and "Ru" in that order. The first layer (Ta: tantalum) is an undercoat layer, while the second layer (PtMn) is an antiferromagnetic layer. The layers from the third layer to the fifth layer (70CoFe, Ru, CoFeB) form fixed magnetization layers. The substantive fixed magnetization layer is the fifth layer ferromagnetic layer comprised of "CoFeB". The sixth layer (MgO: magnesium oxide) is an insulating layer forming a tunnel barrier layer. The seventh layer (CoFeB) is a ferromagnetic layer forming a free magnetization layer. The sixth layer (MgO) forms an intermediate layer between the pair of ferromagnetic layers (CoFeB) arranged at the top and bottom. The eighth layer (Ta: tantalum) and the ninth layer (Ru: ruthenium) form hard mask layers. The fixed magnetization layer (fifth layer "CoFeB"), the tunnel barrier layer (sixth layer "MgO"), and free magnetization layer (seventh layer "CoFeB") form the TMR device part 12 in the strict sense as a basic structure. The fixed magnetization layer fifth layer "CoFeB" and the free magnetization layer seventh layer "CoFeB" are known as amorphous ferromagnetic bodies in the as-deposited state. The tunnel barrier layer constituted by the MgO layer is formed so as to have a a single crystal or highly oriented fiber-texture structure across the thickness direction.

Note that, in FIG. 1, the figures in parentheses at the layers indicate the thicknesses of the layers in units of "nm (nanometers)". The thicknesses are examples. The invention is not limited to them.

Figure 2:
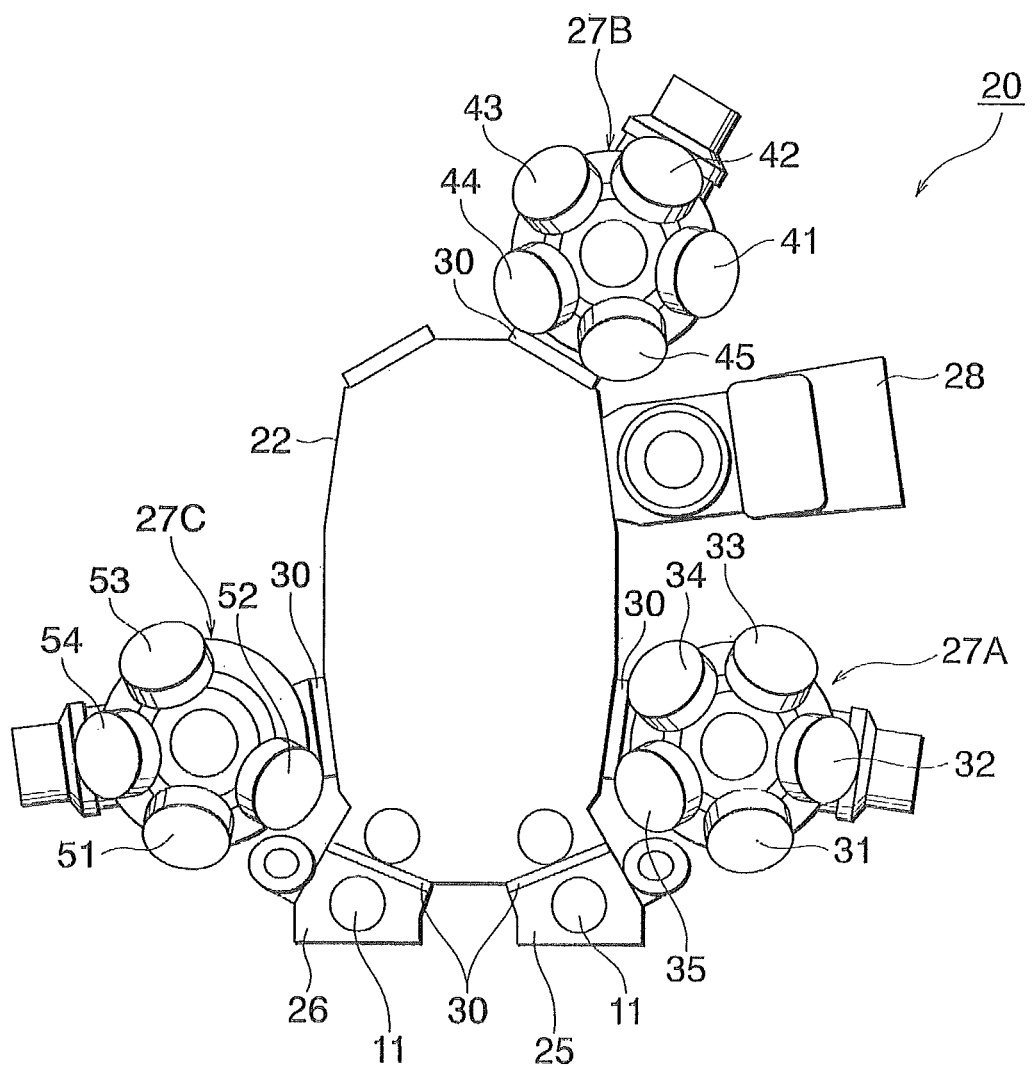
FIG. 2 is a plan view of a system for fabricating a magnetoresistance effect device (TMR device) according to an embodiment of the present invention.

Next, referring to FIG. 2, a system and method for producing a TMR device 10 having the above multilayer structure will be explained. FIG. 2 is a schematic plan view of a system for producing a TMR device 10. This system can produce a multilayer film including a plurality of magnetic fields and is a sputtering film-forming system for mass production.

The magnetic multilayer film fabrication system 20 shown in FIG. 2 is a cluster type system provided with a plurality of film-forming chambers using the sputtering method. In this system 20, a transport chamber 22 provided with not shown robot loaders at the center position. The transport chamber 22 of the magnetic multilayer film fabrication system 20 is provided with two load/unload chambers 25 and 26 which load/unload substrates (silicon substrates) 11. These load/unload chambers 25 and 26 are used alternately to enable fabrication of a multilayer film with a good productivity.

In this magnetic multilayer film fabrication system 20, the transport chamber 22 is surrounded with, for example, three film-forming chambers 27A, 27B, and 27C and one etching chamber 28. In the etching chamber 28, the required surface of a TMR device 10 is etched. At the interface with each chamber, a gate valve 30 separating the two chambers and able to open/close the passage between them is provided. Note that each chamber is also provided with a not shown evacuation mechanism, gas introduction mechanism, power supply mechanism, etc.

The film-forming chambers 27A, 27B, and 27C of the magnetic multilayer film fabrication system 20 use the sputtering method to deposit the above-mentioned magnetic films on the substrate 11 successively from the bottom. For example, the ceilings of the film-forming chambers 27A, 27B, and 27C are provided with four or five targets (31, 32, 33, 34, 35), (41, 42, 43, 44, 45), and (51, 52, 53, 54) arranged on suitable circumferences. Substrate holders positioned coaxially with the circumferences carry substrates on them.

In the above explanation, for example, the target 31 is made of "Ta", while the target 33 is made of "CoFeB". Further, the target 41 is made of "PtMn", the target 42 is made of "CoFe", and the target 43 is made of "Ru". Further, the target 51 is made of "MgO".

The above plurality of targets are provided suitably inclined so as to suitably face the substrate so as to efficiently deposit magnetic films of suitable formulations, but they may also be provided in states parallel to the substrate surface. Further, they are arranged to enable the plurality of targets and the substrate to relatively rotate. In the system 20 having this configuration, the film-forming chambers 27A, 27B, and 27C are utilized to successively form films of the magnetic multilayer film shown in FIG. 1 on the substrate 11 by the sputtering method.

The film-forming conditions of the TMR device part 12 forming the portion of the main elements of the present invention will be explained. The fixed magnetization layer (fifth layer "CoFeB") is formed using a CoFeB 60/20/20 at % target at an Ar pressure of 0.03 Pa, a magnetron DC sputtering, and a sputtering rate of 0.64 Å/sec. Next, the tunnel barrier layer (sixth layer "MgO") is formed using a MgO 50/50 at % target, a sputter gas of Ar, and a pressure changed in the range of 0.01 to 0.4 Pa. Magnetron RF sputtering is used to form the film at a sputtering rate of 0.14 Å/sec. Next, the free magnetization layer (seventh layer "CoFeB") is formed under the same film-forming conditions as the fixed magnetization layer (fifth layer "CoFeB").

In this embodiment, the film-forming speed of the MgO film was 0.14 Å/sec, but the film may also be formed at a speed in the range of 0.01 to 1.0 Å/sec.

The TMR device 10 finished being formed with films by sputtering in the film-forming chambers 27A, 27B, and 27C is annealed in a heat treatment oven. At this time, the annealing temperature is for example about 300° C. The annealing is performed in a magnetic field of for example 8 kOe (632 kA/m) for example for 4 hours. Due to this, the PtMn of the second layer of the TMR device 10 is given the required magnetization alignment.

Figure 3:
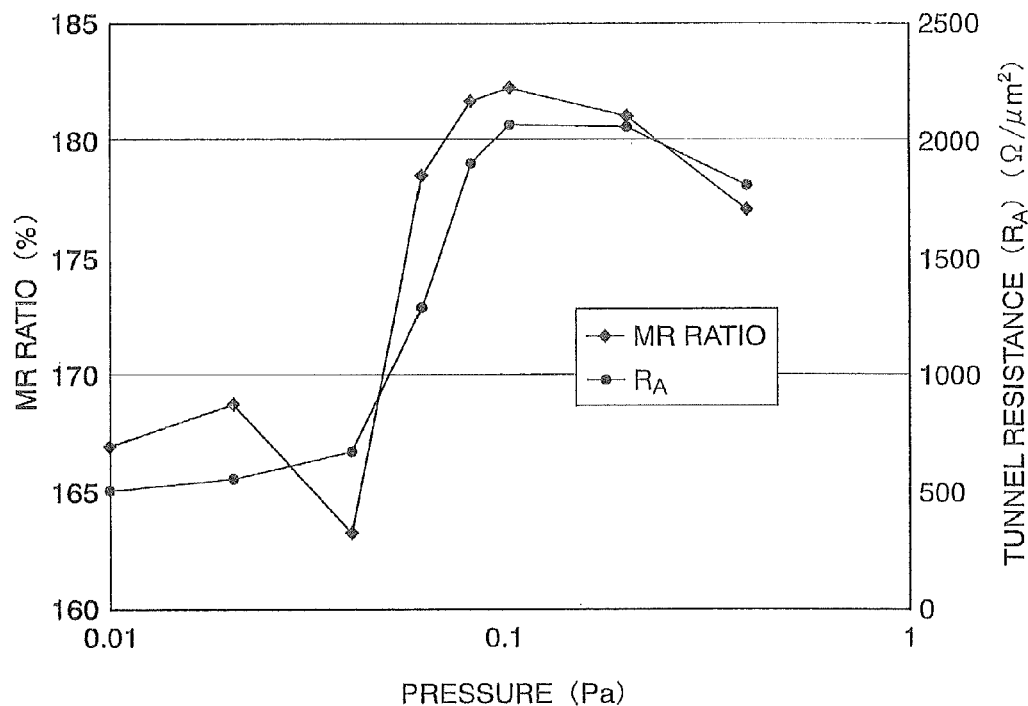
FIG. 3 is a graph of the pressure dependency of magnetic characteristics of a magnetoresistance effect device (TMR device) according to an embodiment of the present invention.
Figure 4:
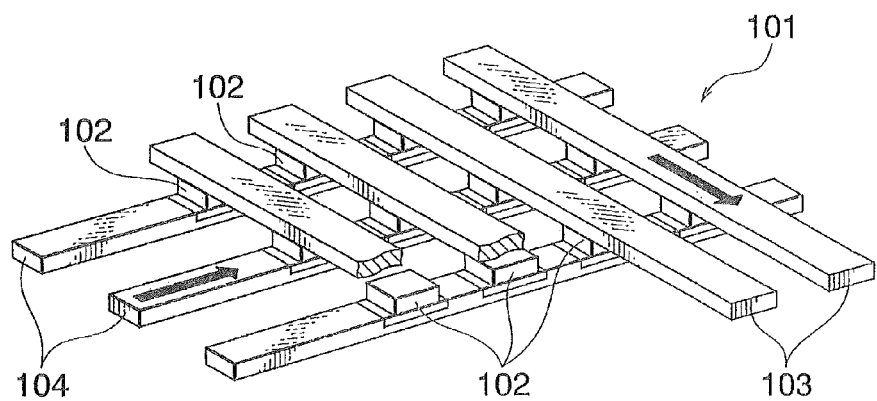
FIG. 4 is a partial perspective view of the principal structure of an MRAM.
Figure 5:
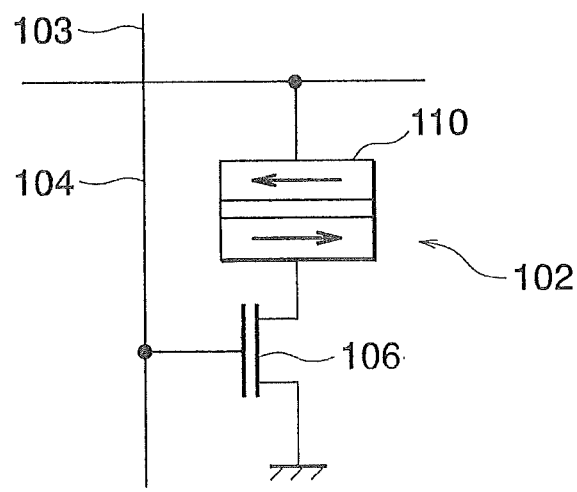
FIG. 5 is a view of the structure of a memory device of an MRAM.
Figure 6:
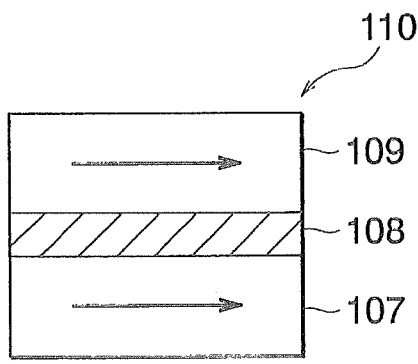
FIG. 6 is a view for explaining the characteristics of a TMR device.
Figure 6:
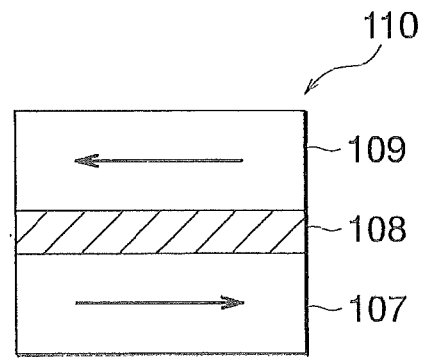

FIG. 3 shows the results of measurement of the magnetic characteristics of MgO. A high MR ratio is obtained over the entire measured range. In particular, in the region of a pressure of 0.05 Pa to 0.2 Pa, a high MR ratio was obtained. In the region of a pressure of 0.05 Pa or more, the pressure on the substrate increases and the ion impact falls believed resulting in a reduction in film defects. With a pressure of 0.05 Pa or more, the MR ratio increases and the tunnel resistance value ($R_A$) increases. This is believed to be due to formation of a good single crystal or highly oriented fiber-texture film and as a result the leakage current of the film is decreased. On the other hand, in the region of 0.05 Pa or less, the tunnel resistance value ($R_A$) falls and the MR ratio also falls. This is believed to be because the ion impact increases—resulting in an increase in defects of the MgO film. A cross-section of a sample was observed by a transmission electron microscope (TEM). As a result, it was observed that, over the entire range of the measured pressure, the MgO film had a single crystal or highly oriented fiber-texture structure over the entire layer from the bottom interface to the top interface and that the (001) plane of the MgO single crystal or highly oriented fiber-texture was oriented parallel to the interfaces. Further, it was observed that the CoFeB layer was formed in an amorphous state prior to annealing.

This sample was formed by sandwiching the two sides of the MgO layer with ferromagnetic layers of amorphous CoFeB. But even if only one of the ferromagnetic layers was amorphous CoFeB, similar results are observed. Preferably, during deposition of MgO layer the bottom ferromagnetic layer was amorphous. Although the CoFeB ferromagnetic layers were initially amorphous prior to annealing, the CoFeB ferromagnetic layers became crystallized or partly crystallized when subjected to annealing at temperature higher than 300° C. for a few hours. In this case, the MgO layer, sandwiched with crystallized CoFeB ferromagnetic layers, showed a single crystal or highly-oriented fiber texture with the (001) crystal plane of MgO barrier layer lies parallel to the ferromagnetic layer surface. Compared with the samples annealed at 300° C., the samples annealed at higher temperature did not show degradation of magnetic and magnetoresistance properties (MR ratio, $R_A$ etc.).

On the other hand, when forming CoFe having a polycrystalline structure as the ferromagnetic layer at the two sides of the MgO layer, a large number of dislocations are seen in the MgO layer, a good single crystal or highly oriented fiber-texture film cannot be obtained, and the magnetoresistance characteristics are low.

At this time, as explained above, an MgO target 51 was used as the target. Preferably, the RF (high frequency) magnetron sputtering method was used. Note that the reactive sputtering method may also be used to sputter the Mg target by a mixed gas of Ar and $O_2$ and form an MgO film.

Note that above, the MgO layer is a single crystal or highly oriented fiber-texture throughout the layer and has a single crystal or highly oriented fiber-texture structure with an (001) plane oriented parallel to the interfaces. Further, the pair of ferromagnetic layers forming the TMR device part 12 may also be, instead of the CoFeB having an amorphous state, CoFeTaZr, CoTaZr, CoFeNbZr, CoFeZr, FeTaC, FeTaN, FeC, or other ferromagnetic layers having an amorphous state.

The configurations, shapes, sizes (thicknesses), and layouts explained in the above embodiments are only shown schematically to an extent enabling the present invention to be understood and worked. Further, the numerical values and compositions (materials) are only shown for illustration. Therefore, the present invention is not limited to the explained embodiments and can be changed in various ways within the scope of the technical idea shown in the claims.

The present invention contains subject matter related to Japanese Patent Application No. 2004-259280 filed on filed in the Japan Patent Office on Sep. 7, 2004, the entire contents of which being incorporated herein by reference.

The invention claimed is:

1. A tunneling magnetoresistive junction comprising:
 a plurality of ferromagnetic layers;
 a tunnel barrier layer being in direct contact with a first of the ferromagnetic layers;
 a second of the ferromagnetic layers which is in direct contact with the tunnel barrier layer and disposed on the opposite side of the first ferromagnetic layer;
 a Ru layer arranged such that the second ferromagnetic layer is between the Ru layer and the tunnel barrier layer;
 wherein the first ferromagnetic layer and the second ferromagnetic layer comprise CoFeB;
 wherein the tunnel barrier layer comprises MgO; and
 wherein two of the ferromagnetic layers are arranged such that the Ru layer is between the two ferromagnetic layers.

2. The tunneling magnetoresistive junction as set forth in claim 1, wherein said tunnel barrier layer is a 001 crystal structure.

3. The tunneling magnetoresistive junction as set forth in claim 1, wherein said tunnel barrier layer has an interface with the second ferromagnetic layer, and said barrier layer has an oriented fiber-texture in the tunnel barrier layer's thickness direction extending from the interface to an interface between the barrier layer and the first ferromagnetic layer.

* * * * *